(12) United States Patent
Yu

(10) Patent No.: US 6,395,589 B1
(45) Date of Patent: May 28, 2002

(54) FABRICATION OF FULLY DEPLETED FIELD EFFECT TRANSISTOR WITH HIGH-K GATE DIELECTRIC IN SOI TECHNOLOGY

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/781,783

(22) Filed: Feb. 12, 2001

(51) Int. Cl.$^7$ ............................................. H01L 21/338
(52) U.S. Cl. ....................... 438/183; 438/300; 438/305; 438/306; 438/682
(58) Field of Search ................................. 438/183, 300, 438/682, 305, 306

(56) References Cited

U.S. PATENT DOCUMENTS

| | | | |
|---|---|---|---|
| 5,962,895 A | * 10/1999 | Beyer et al. ................. | 257/347 |
| 6,051,473 A | * 4/2000 | Ishida et al. ................ | 438/300 |
| 6,087,235 A | * 7/2000 | Yu ............................. | 438/300 |
| 6,307,230 B1 | * 10/2001 | Chatterjee et al. .......... | 257/327 |
| 6,171,910 B1 | * 1/2002 | Hobbs et al. ............... | 438/275 |

FOREIGN PATENT DOCUMENTS

EP        0923118 A2  *  6/1999

* cited by examiner

Primary Examiner—Long Pham

(74) Attorney, Agent, or Firm—Monica H. Choi

(57) ABSTRACT

For fabricating a field effect transistor on a semiconductor substrate in SOI (semiconductor on insulator) technology, an insulating block comprised of insulating material is formed on a thin semiconductor island comprised of semiconductor material. Semiconductor material is further grown from sidewalls of the semiconductor island to extend up along sidewalls of the insulating block to form a raised drain structure on a first side of the insulating block and the semiconductor island and to form a raised source structure on a second side of the insulating block and the semiconductor island. A drain and source dopant is implanted into the raised drain and source structures. A thermal anneal is performed to activate the drain and source dopant within the raised drain and source structures and such that the drain and source dopant extends partially into the semiconductor island. Drain and source silicides are formed within the raised drain and source structures. The insulating block is etched away to form a block opening. A gate dielectric comprised of a high dielectric constant material is deposited at a bottom wall of the block opening after the thermal anneal and after formation of the drain and source silicides. The block opening is filled with a conductive material to form a gate structure disposed over the semiconductor island. The portion of the semiconductor island disposed under the gate structure forms a channel region that is fully depleted during operation of the field effect transistor. In this manner, the gate dielectric comprised of the high dielectric constant material is formed after any process step using a relatively high temperature of greater than about 750° Celsius to preserve the integrity of the gate dielectric comprised of a high-K dielectric material.

11 Claims, 6 Drawing Sheets

FABRICATION OF FULLY DEPLETED FIELD EFFECT TRANSISTOR WITH HIGH-K GATE DIELECTRIC IN SOI TECHNOLOGY

TECHNICAL FIELD

The present invention relates generally to fabrication of field effect transistors having scaled-down dimensions, and more particularly, to a process for fabricating a field effect transistor having a fully depleted channel region and having raised source and drain, with preservation of the gate dielectric having a high dielectric constant, in SOI (semiconductor on insulator) technology for the field effect transistor having scaled down dimensions of tens of nanometers.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be comprised of polysilicon. A gate silicide 120 is formed on the polysilicon gate structure 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate structure 118 and the gate dielectric 116. When the spacer 122 is comprised of silicon nitride ($Si_3N_4$), then a spacer liner oxide 124 is deposited as a buffer layer between the spacer 122 and the sidewalls of the gate structure 118 and the gate dielectric 116.

As the dimensions of the MOSFET 100 are scaled down to tens of nanometers, short-channel effects degrade the performance of the MOSFET 100. Short-channel effects that result due to the short length of the channel between the drain extension 104 and the source extension 106 of the MOSFET 100 are known to one of ordinary skill in the art of integrated circuit fabrication. The electrical characteristics of the MOSFET 100 become difficult to control with bias on the gate structure 118 with short-channel effects which may severely degrade the performance of the MOSFET.

Referring to FIG. 2, to enhance the control of the electrical characteristics, a MOSFET (Metal Oxide Semiconductor Field Effect Transistor) 150 is fabricate in SOI (semiconductor on insulator) technology. In SOI technology, a layer of buried insulating material 132 is deposited on the semiconductor substrate 102. The layer of buried insulating material 132 is typically comprised of silicon dioxide ($SiO_2$) when the semiconductor substrate 102 is comprised of silicon. In addition, a thin silicon film 134 is deposited on the layer of buried insulating material 132.

A gate dielectric 136 and a gate structure 138 are formed on the thin silicon film 134. A drain and source dopant is implanted into exposed regions of the thin silicon film 134 to form a drain 142 and a source 144 of the MOSFET 150. A channel region of the MOSFET 150 is the portion of the thin silicon film 134 disposed between the drain 142 and the source 144 and disposed below the gate dielectric 136. The silicon film 134 is relatively thin having a thickness in a range of from about 5 nanometers to about 20 nanometers for example. Thus, the channel region of the MOSFET 150 is fully depleted during operation of the MOSFET 150 with improved control of electrical characteristics of the MOSFET 150, as known to one of ordinary skill in the art of integrated circuit fabrication. Thus, the filly depleted channel region of the MOSFET 150 formed in SOI technology minimizes undesired short-channel effects.

Unfortunately, thick drain and source silicides cannot be formed in the drain 142 and the source 144 of the relatively thin silicon film 134. However, thick suicides for providing contact to the drain 142 and the source 144 are desired for minimizing series resistance at the drain and source of the MOSFET 150. Nevertheless, fabrication of a MOSFET having a fully depleted channel region within a thin silicon film in SOI (semiconductor on insulator) technology is also desired for minimizing undesired short channel effects. Thus, a mechanism is desired for forming thick drain and source silicides for the MOSFET having a fully depleted channel region within a thin silicon film in SOI (semiconductor on insulator) technology.

In addition, as the dimensions of the MOSFET 150 are further scaled down, the thickness of the gate dielectric 136 is also scaled down. However, with a thinner gate dielectric 136, more charge carriers tunnel through the thin gate dielectric 136 to result in undesired leakage current at the gate of the MOSFET 150, as known to one of ordinary skill in the art of integrated circuit fabrication. To minimize such undesired leakage current, a dielectric material having a dielectric constant that is higher than the dielectric constant of silicon dioxide ($SiO_2$) (i.e., a high-K dielectric material) is used for the gate dielectric 136, as known to one of ordinary skill in the art of integrated circuit fabrication. The gate dielectric 136 has a higher thickness when comprised of such a high-K dielectric material than when comprised of silicon dioxide ($SiO_2$) for the same drive current of the MOSFET 150 to minimize undesired tunneling current through the gate dielectric 136.

However, the high-K dielectric material, such as metal oxide for example, of the gate dielectric 136 may react with the semiconductor substrate 102 comprised of silicon for example, at any temperature greater than about 750° Celsius to degrade the gate dielectric 136. Thus, a mechanism is desired for forming thick drain and source silicides for the field effect transistor having a fully depleted channel region within a thin silicon film in SOI (semiconductor on insulator) technology while also preserving the integrity of the gate dielectric comprised of a high-K dielectric material.

SUMMARY OF THE INVENTION

Accordingly, in a general aspect of the present invention, raised drain and source structures are formed by epitaxial growth of a semiconductor material from sidewalls of a thin film semiconductor island forming the fully depleted channel region and thick drain and source suicides are formed within the raised drain and source structures. Any process step requiring a relatively high temperature of greater than about 750° Celsius, such as formation of the drain and source silicides, is performed before formation of the gate dielectric comprised of high-K dielectric material to preserve the integrity of the gate dielectric.

In one embodiment of the present invention, for fabricating a field effect transistor on a semiconductor substrate in SOI (semiconductor on insulator) technology, a film of semiconductor material is deposited on a layer of buried insulating material formed on the semiconductor substrate. A layer of active insulating material is deposited on the film of semiconductor material. A masking material is patterned to form a masking structure, and any portion of the layer of active insulating material and the film of semiconductor material not under the masking structure is etched away. The layer of active insulating material remaining under the masking structure forms an insulating block, and the film of semiconductor material remaining under the insulating block forms a semiconductor island. The masking structure is removed from the top of the insulating block.

A semiconductor material is grown from sidewalls of the semiconductor island to extend up along sidewalls of the insulating block to form a raised drain structure on a first side of the insulating block and the semiconductor island and to form a raised source structure on a second side of the insulating block and the semiconductor island. A drain and source dopant is implanted into the raised drain and source structures. A thermal anneal is performed to activate the drain and source dopant within the raised drain and source structures and such that the drain and source dopant extends partially into the semiconductor island.

A drain silicide is formed within the raised drain structure, and a source silicide is formed within the raised source structure. The insulating block is etched away to form a block opening. A gate dialectric comprised of a high dielectric constant material having a dielectric constant that is higher than the dielectric constant of silicon dioxide (SiO$_2$) is deposited at a bottom wall of the block opening after the thermal anneal and after formation of the drain and source suicides. The steps of the thermal anneal and formation of the drain and source suicides typically use relatively high temperatures of greater than about 750° Celsius. The block opening is filled with a conductive material to form a gate structure disposed over the semiconductor island. The portion of the semiconductor island disposed under the gate structure forms a channel region that is fully depleted during operation of the field effect transistor.

In this manner, the gate dielectric comprised of high dielectric constant material is formed after any process step using a relatively high temperature of greater than about 750° Celsius to preserve the integrity of the gate dielectric. In addition, the drain and source silicides formed in the raised drain and source structures may be formed to have a higher thickness than the relatively thin semiconductor island to minimize series resistance at the drain and source of the field effect transistor. Furthermore, the channel region of the field effect transistor formed from the relatively thin semiconductor island is fully depleted during operation to the field effect transistor to minimize undesired short channel effects.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, and 17 refer to elements having similar structure and function.

DETAILED DESCRIPTION

Figure 1:
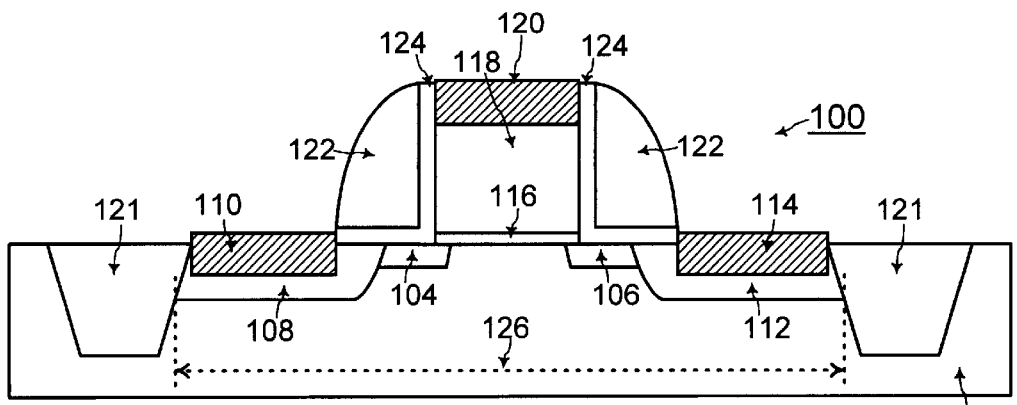
FIG. 1 shows a cross-sectional view of a conventional MOSFET (Metal Oxide Semiconductor Field Effect Transistor) formed within a semiconductor substrate.
Figure 2:
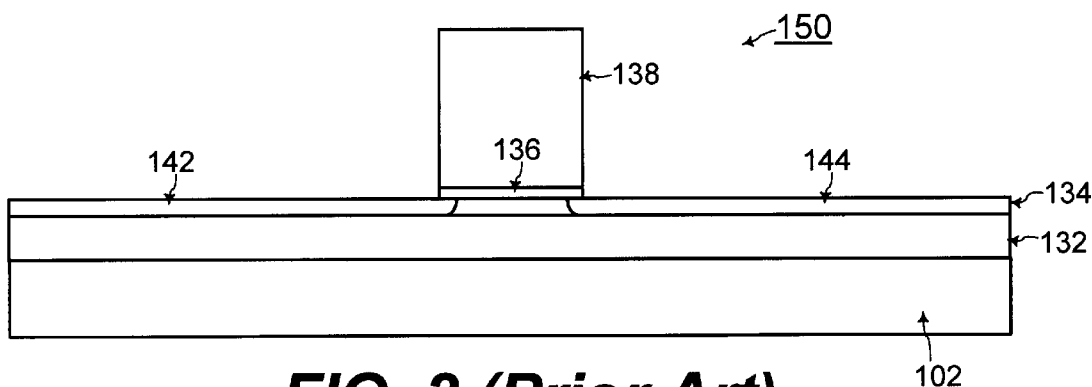
FIG. 2 shows a cross-sectional view of a conventional MOSFET (Metal Oxide Semiconductor Field Effect Transistor) formed within a thin semiconductor film in SOI (semiconductor on insulator) technology without raised drain and source structures, according to the prior art.
Figure 3:
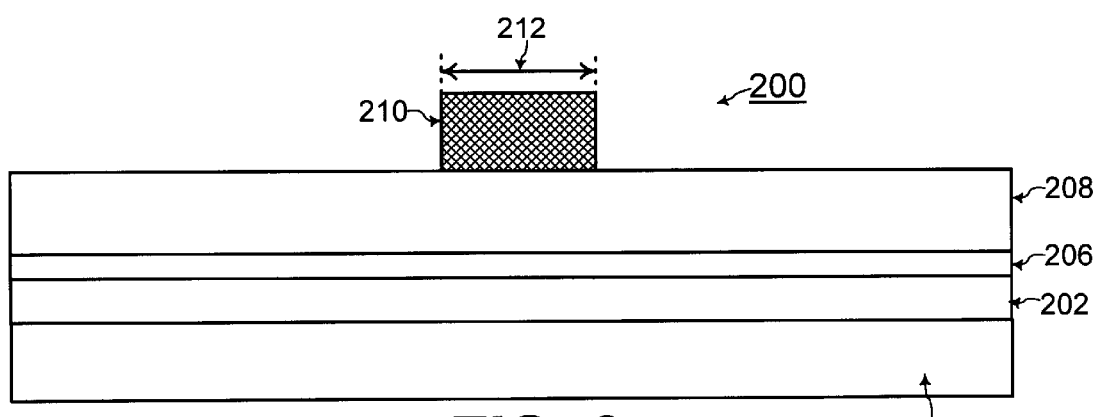
FIGS. 3, 4, 5, 6, 7, 8, 9, 10, 11, 12, 13, 14, 15, 16, and 17 show cross-sectional views for illustrating the steps for fabricating a MOSFET (Metal Oxide Semiconductor Field Effect Transistor) with a fully depleted channel region formed from a thin semiconductor film and with thick drain and source silicides formed within raised drain and source structures while preserving the integrity of the gate dielectric comprised of a high-K dielectric material, according to one embodiment of the present invention.

Referring to FIG. 3, for fabricating a MOSFET 200 in SOI (semiconductor on insulator) technology, a layer of buried insulating material 202 is formed on a semiconductor substrate 204. The semiconductor substrate 204 is typically comprised of silicon, and the layer of buried insulating material 202 is typically comprised of silicon dioxide (SiO$_2$). Processes for deposition of such a layer of buried insulating material 202 are known to one of ordinary skill in the art of integrated circuit fabrication.

A relatively thin film of semiconductor material 206 is deposited on the layer of buried insulating material 202. The film of semiconductor material 206 is comprised of silicon having a thickness in a range of from about 5 nanometers to about 20 nanometers according to an embodiment of the present invention. Processes for deposition of such a film of semiconductor material 206 are known to one of ordinary skill in the art of integrated circuit fabrication.

A layer of active insulating material 208 is deposited on the film of semiconductor material 206. In one embodiment of the present invention, the layer of active insulating material 208 is comprised of silicon nitride (Si$_3$N$_4$) having a thickness in a range of from about 100 nanometers to about 200 nanometers. Processes for deposition of such a layer of active insulating material 208 are known to one of ordinary skill in the art of integrated circuit fabrication.

Further referring to FIG. 3, a layer of masking material, such as photoresist material, is deposited and patterned to form a masking structure 210. In one embodiment of the present invention, the masking structure 210 has a width 212 in the range of from about 50 nanometers to about 300 nanometers. Processes for depositing and patterning photoresist material to form such a masking structure 210 are known to one of ordinary skill in the art of integrated circuit fabrication.

Figure 4:
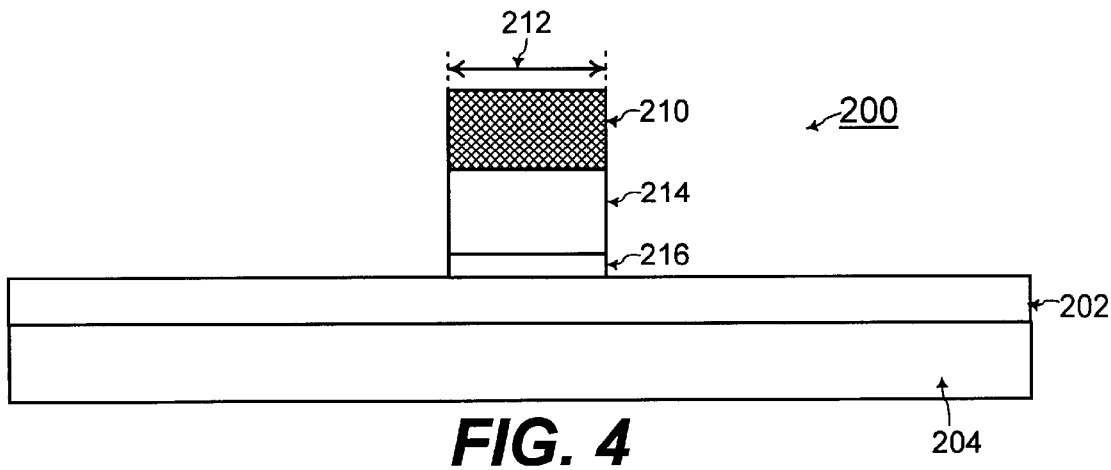

Referring to FIGS. 3 and 4, any region of the layer of active insulating material 208 and the film of semiconductor material 206 not under the masking structure 210 is etched away. The layer of active insulating material 208 remaining under the masking structure 210 forms an insulating block 214, and the film of semiconductor material 206 remaining under the insulating block 214 forms a semiconductor island 216. The insulating block 214 and the semiconductor island 216 have the width 212 of the masking structure 210. Processes for etching the layer of active insulating material 208 and the film of semiconductor material 206 are known to one of ordinary skill in the art of integrated circuit fabrication.

Figure 5:
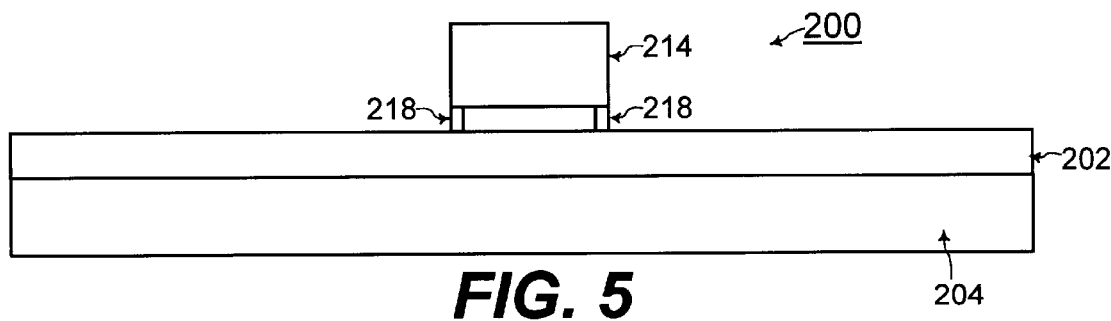
Figure 6:
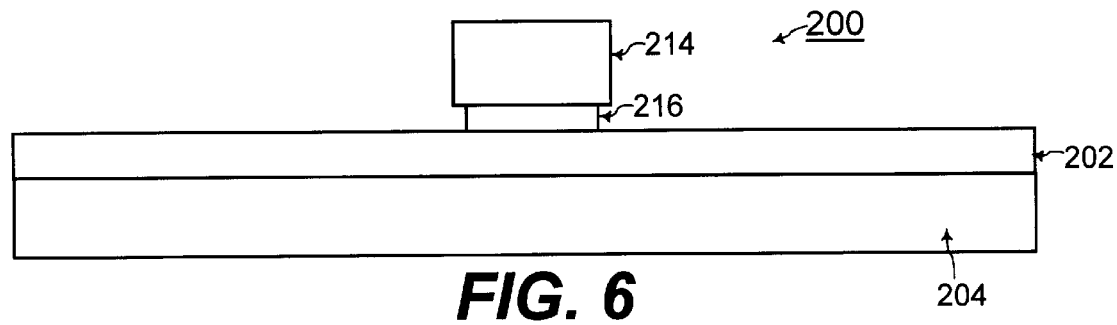

Referring to FIG. 5, sacrificial oxide 218 having a width in a range of from about 20 angstroms to about 50 angstroms is formed at sidewalls of the semiconductor island 216. Processes for forming the sacrificial oxide 218 at the sidewalls of the semiconductor island 216 are known to one of ordinary skill in the art of integrated circuit fabrication. Referring to FIG. 6, the sacrificial oxide 218 is etched away from the sidewalls of the semiconductor island 216. Processes for etching away the sacrificial oxide 218 from the sidewalls of the semiconductor island 216 are known to one of ordinary skill in the art of integrated circuit fabrication. The sacrificial oxide 218 is formed and etched away from the sidewalls of the semiconductor island 216 to remove surface damage at the sidewalls of the semiconductor island 216 from the etching process of FIG. 4.

Figure 7:
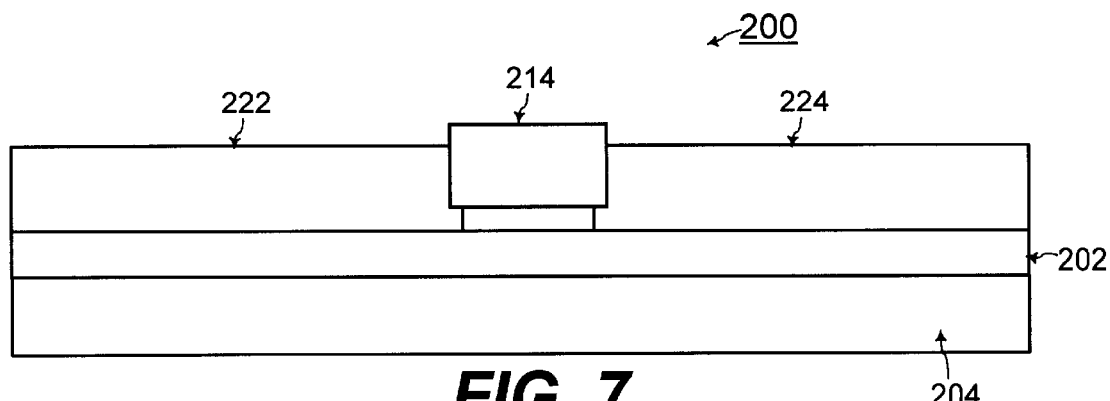

Referring to FIG. 7, semiconductor material is grown from the sidewalls of the semiconductor island 216 up along the insulating block 214. When the semiconductor island 216 is comprised of silicon, silicon is epitaxially grown from the sidewalls of the semiconductor island 216 in an epitaxy deposition process using a relatively high temperature in the range of from about 1100° Celsius to about 1200° Celsius according to one embodiment of the present invention. The silicon grown to a first side of the insulating block 214 and the semiconductor island 216 forms a raised drain structure 222, and the silicon grown to a second side of the insulating block 214 and the semiconductor island 216 forms a raised source structure 224. Processes, such as an epitaxy deposition process, for epitaxially growing silicon from an exposed surface of silicon are known to one of ordinary skill in the art of integrated circuit fabrication.

Figure 8:
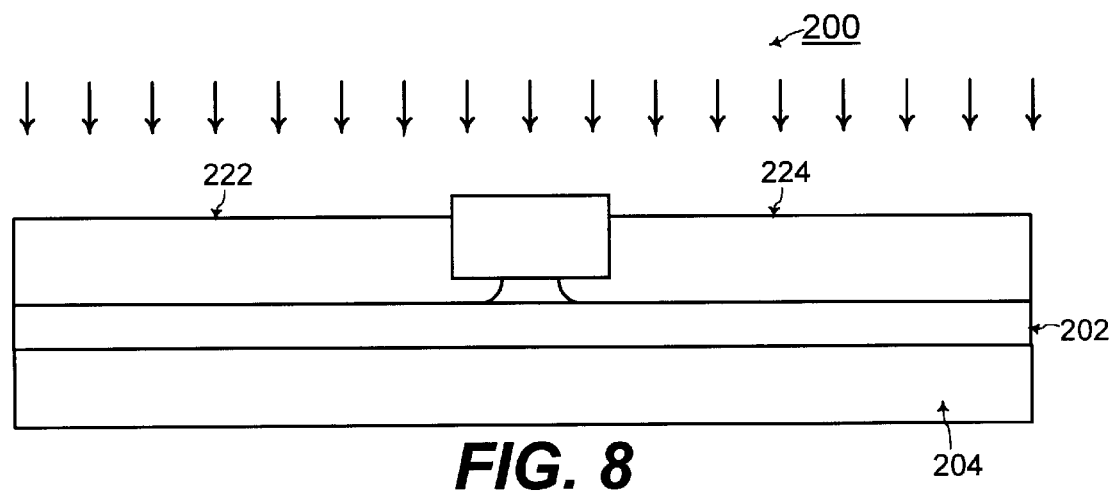

Referring to FIG. 8, a drain and source dopant is implanted into the raised drain and source structures 222 and 224. The drain and source dopant is an N-type dopant for forming an NMOSFET (N-channel Metal Oxide Semiconductor Field Effect Transistor). Alternatively, the drain and source dopant is a P-type dopant for forming a PMOSFET (P-channel Metal Oxide Semiconductor Field Effect Transistor). Processes for implantation of the drain and source dopant are known to one of ordinary skill in the art of integrated circuit fabrication.

After implantation of the drain and source dopant, a thermal anneal is performed to activate the drain and source dopant within the raised drain and source structures 222 and 224 and such that the drain and source dopant extends partially into the semiconductor island under the insulating block 214. In one embodiment of the present invention, the thermal anneal process uses a temperature in a range of from about 900° Celsius to about 1100° Celsius. Thermal anneal processes for activating dopant are known to one of ordinary skill in the art of integrated circuit fabrication.

Figure 9:
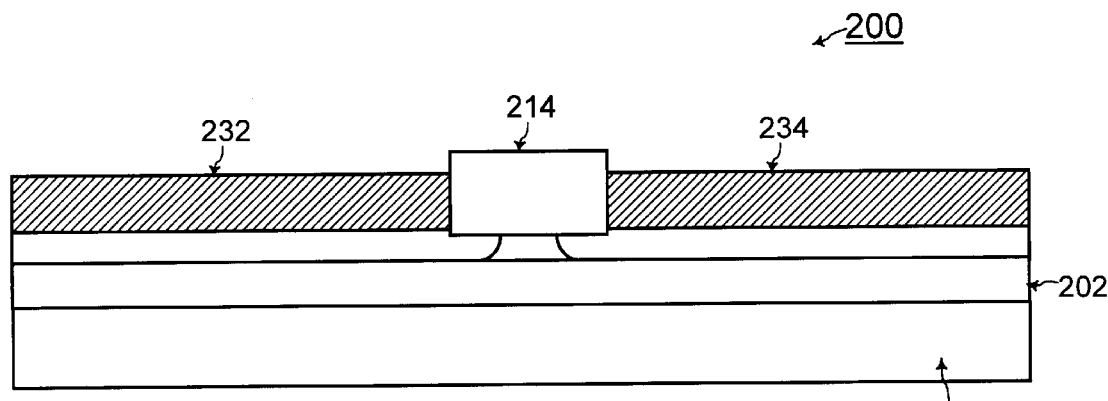

Referring to FIG. 9, a drain silicide 232 is formed within the raised drain structure 222, and a source silicide 234 is formed within the raised source structure 224. The drain and source silicides 232 and 234 may be comprised of a metal silicide, such as cobalt silicide ($CoSi_2$) for example, formed in a silicidation process using a relatively high temperature in a range of from about 800° Celsius to about 825° Celsius, according to one embodiment of the present invention. Silicidation processes for forming such drain and source silicides 232 and 234 are known to one of ordinary skill in the art of integrated circuit fabrication.

Figure 10:
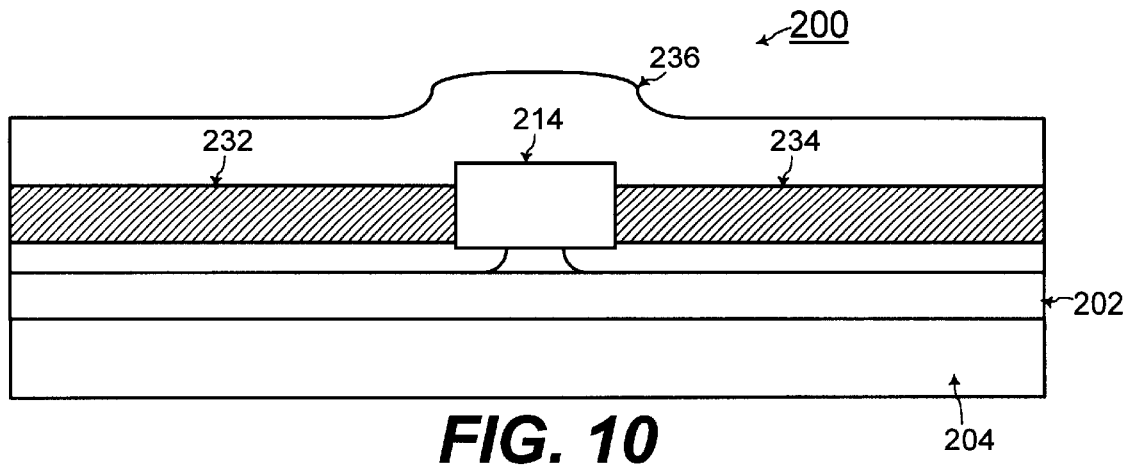

Referring to FIG. 10, a capping insulating layer 236 such as a capping oxide layer (i.e., comprised of silicon dioxide ($SiO_2$) in one embodiment of the present invention) is deposited to cover the drain and source silicides 232 and 234. Processes for depositing the capping oxide layer 236 are known to one of ordinary skill in the art of integrated circuit fabrication.

Figure 11:
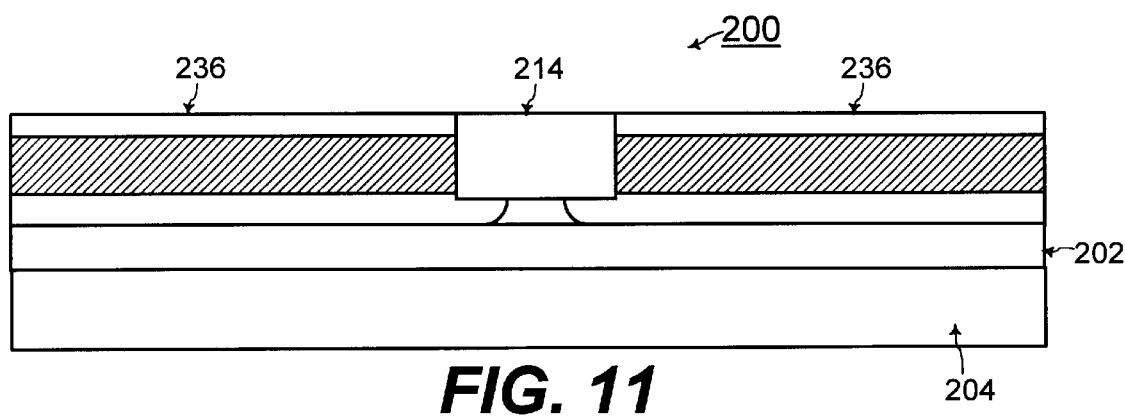

Referring to FIG. 11, the capping oxide layer 236 is polished down to be level with the insulating block 214. The remaining capping oxide layer 236 covers the drain and source silicides 232 and 234. Processes, such as CMP (chemical mechanical polishing) processes, for polishing down the capping oxide layer 236 are known to one of ordinary skill in the art of integrated circuit fabrication.

Figure 12:
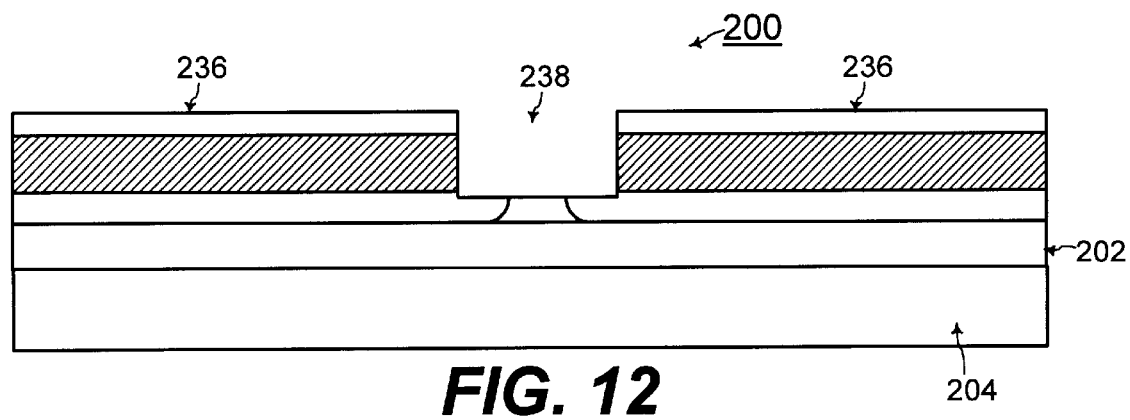

Referring to FIG. 12, the insulating block 214 is etched away to form a block opening 238. Processes for etching away the insulating block 214 which is comprised of silicon nitride ($Si_3N_4$) for example are known to one of ordinary skill in the art of integrated circuit fabrication.

Figure 13:
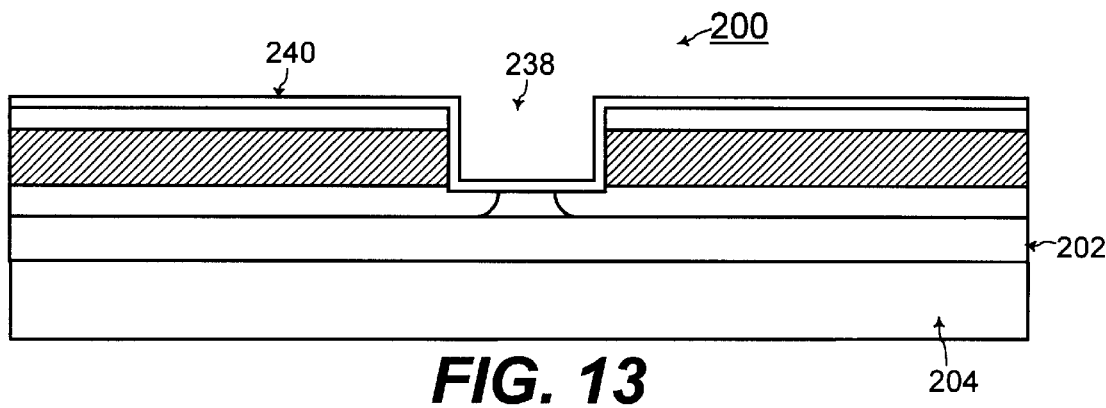

Referring to FIG. 13, a layer of gate dielectric material 240 is conformally deposited on the capping oxide layer 236 and on the sidewalls and the bottom wall of the block opening 238. The layer of gate dielectric material 240 is comprised of a high dielectric constant material having a dielectric constant that is higher than the dielectric constant of silicon dioxide ($SiO_2$) to minimize undesired tunneling current through the gate dielectric of the MOSFET 200. The layer of gate dielectric material 240 may be comprised of metal oxide in one embodiment of the present invention. In that case, the capping oxide layer 236 blocks any metal reactant from the drain and source suicides 232 and 234 to prevent further silicidation of the raised drain and source structures 222 and 224 during deposition of the layer of gate dielectric material 240. Processes for conformally depositing such a layer of gate dielectric material 240 are known to one of ordinary skill in the art of integrated circuit fabrication.

Figure 14:
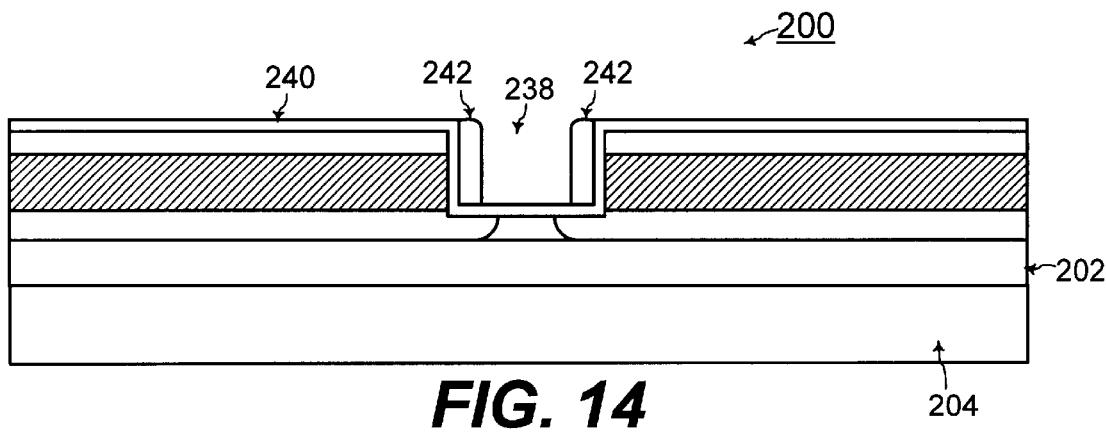
Figure 15:
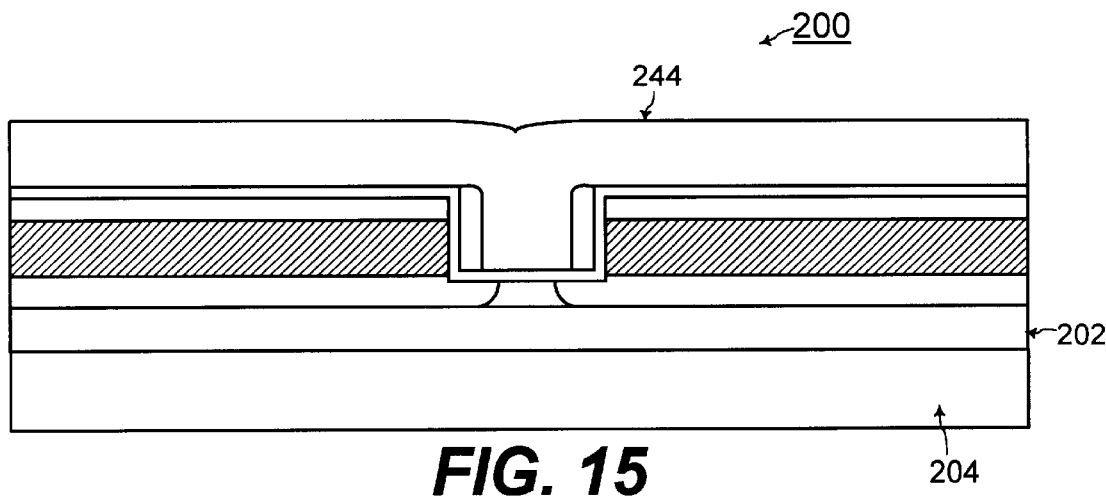

Referring to FIG. 14, spacers 242 are formed on the sidewalls of the block opening 238. In one embodiment of the present invention, the spacers 242 are comprised of silicon nitride ($Si_3N_4$), and processes for forming such spacers on sidewalls of an opening are known to one of ordinary skill in the art of integrated circuit fabrication. Such spacers 242 are formed to reduce the channel length of the MOSFET 200. Referring to FIG. 15, a conductive material 244 is deposited to fill the block opening 238. In one embodiment of the present invention, the conductive material 244 is comprised of metal such as titanium nitride, tungsten, or molybdenum. Processes for depositing such conductive material 244 are known to one of ordinary skill in the art of integrated circuit fabrication.

Figure 16:
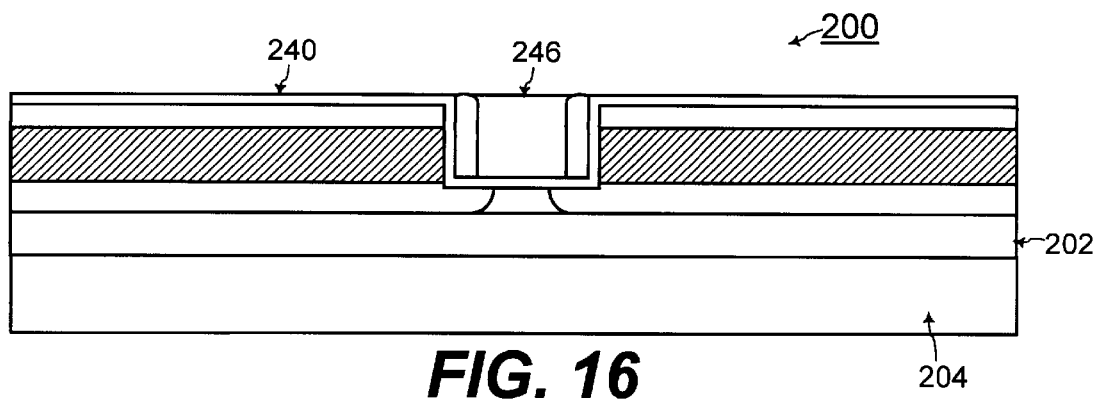

Referring to FIG. 16, the conductive material 244 is polished down until the layer of gate dielectric material 240 is exposed such that the conductive material 244 contained within the block opening 238 forms a gate structure 246. Processes, such as CMP (chemical mechanical polishing) processes, for polishing down the conductive material 244 are known to one of ordinary skill in the art of integrated circuit fabrication.

The portion of the layer of gate dielectric material 240 disposed under the gate structure 246 forms the gate dielectric of the MOSFET 200. The drain and source dopant extends partially under the gate structure 246 for proper operation of the MOSFET 200 from thermal diffusion of the drain and source dopant into the semiconductor island 216 during the thermal anneal process for activating the drain and source dopant.

Figure 17:
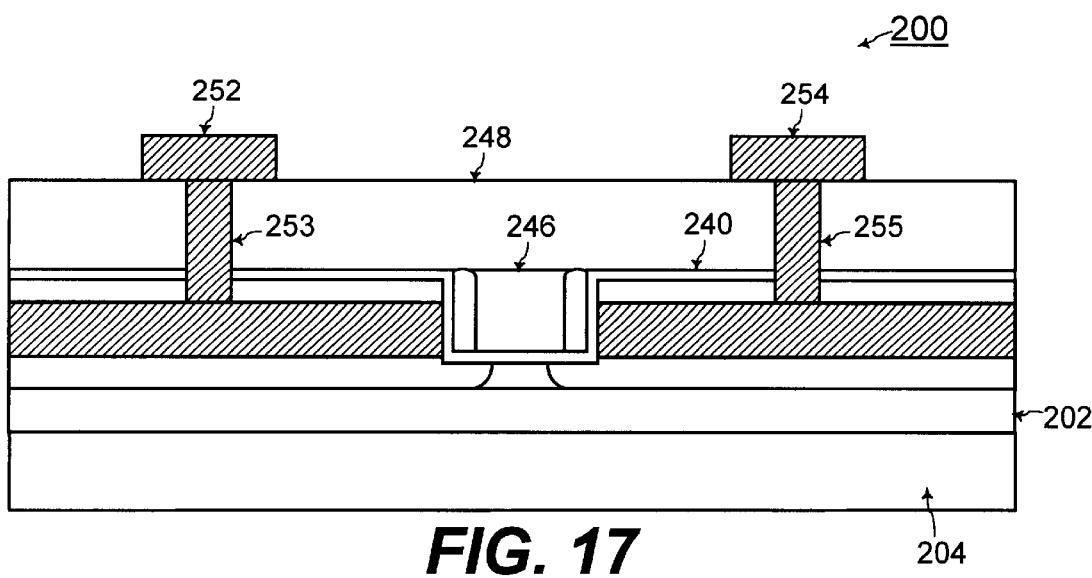

Referring to FIG. 17, a field insulating material 248 is blanket deposited. A drain interconnect 252 and a drain contact 253 are formed for providing contact to the drain silicide 242, and a source interconnect 254 and a source contact 255 are formed for providing contact to the source silicide 244. Processes for formation of such interconnect structures are known to one of ordinary skill in the art of integrated circuit fabrication.

In this manner, the gate dielectric comprised of the high dielectric constant material is formed after any process step using a relatively high temperature of greater than about 750° Celsius to preserve the integrity of the gate dielectric. For example, the step of epitaxially growing silicon from the sidewalls of the semiconductor island 216 using a relatively high temperature in the range of from about 1100° Celsius to about 1200° Celsius, the step of activating the drain and source dopant in the thermal anneal process using a temperature in a range of from about 900° Celsius to about 1100° Celsius, and the step of forming the drain and source silicides 232 and 234 in a silicidation process using a relatively high temperature in a range of from about 800° Celsius to about 825° Celsius are performed before deposition of the layer of gate dielectric material 240.

In addition, the drain and source silicides formed in the raised drain and source structures may be formed to have a higher thickness than the relatively thin semiconductor island to minimize series resistance at the drain and source of the field effect transistor. Furthermore, the channel region of the field effect transistor formed from the relatively thin semiconductor island is fully depleted during operation to the field effect transistor to minimize undesired short channel effects.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "upside down," "bottom," and "on" as used herein refer to relative location and orientation of various portions of the structures with respect to one another, and are not intended to suggest that any particular absolute orientation with respect to external objects is necessary or required. The present invention is limited only as defined in the following claims and equivalents thereof.

I claim:

1. A method for fabricating a field effect transistor on a semiconductor substrate in SOI (semiconductor on insulator) technology, the method including the sequential steps of:

A. depositing a film of semiconductor material on a layer of buried insulating material formed on said semiconductor substrate;

B. depositing a layer of active insulating material on said film of semiconductor material;

C. patterning a masking material to form a masking structure and etching away any portion of said layer of active insulating material and said film of semiconductor material not under said masking structure;
wherein said layer of active insulating material remaining under said masking structure forms an insulating block, and wherein said film of semiconductor material remaining under said insulating block forms a semiconductor island;

D. removing said masking structure from top of said insulating block;

E. growing a semiconductor material from sidewalls of said semiconductor island to extend up along sidewalls of said insulating block to form a raised drain structure on a first side of said insulating block and said semiconductor island and to form a raised source structure on a second side of said insulating block and said semiconductor island;

F. implanting a drain and source dopant into said raised drain and source structures;

G. performing a thermal anneal to activate said drain and source dopant within said raised drain and source structures and such that said drain and source dopant extends partially into said semiconductor island;

H. forming a drain silicide within said raised drain structure and forming a source silicide within said raised source structure;

I. etching away said insulating block to form a block opening;

J. depositing a gate dielectric comprised of a high dielectric constant material having a dielectric constant that is higher than the dielectric constant of silicon dioxide ($SiO_2$) at a bottom wall of said block opening, after said steps G and H; and K. filling said block opening with a conductive material to form a gate structure disposed over said semiconductor island,
wherein a portion of said semiconductor island disposed under said gate structure forms a channel region that is fully depleted during operation of said field effect transistor.

2. The method of claim 1, wherein said layer of buried insulating material is comprised of silicon dioxide ($SiO_2$), wherein said film of semiconductor material is comprised of silicon having a thickness in a range of from about 5 nanometers to about 20 nanometers, and wherein said layer of active insulating material is comprised of silicon nitride ($Si_3N_4$) having a thickness in a range of from about 100 nanometers to about 200 nanometers.

3. The method of claim 1, wherein said masking structure, said insulating block, and said semiconductor island have a width in a range of from about 50 nanometers to about 300 nanometers.

4. The method of claim 1, further including the step of:
   forming sacrificial oxide on sidewalls of said semiconductor island and etching away said sacrificial oxide from said sidewalls of said semiconductor island to remove surface damage at said sidewalls of said semiconductor island, before said step E.

5. The method of claim 1, further including the steps of:
   forming a capping oxide layer on said drain and source suicides before said step J;
   and wherein said step J includes the step of:
      conformally depositing a layer of said high dielectric constant material on said capping oxide layer and on sidewalls and said bottom wall of said block opening.

6. The method of claim 1, further comprising the step of:
   forming spacers on sidewalls of said block opening before said step K of filling said block opening with said conductive material to form said gate structure.

7. The method of claim 6, wherein said spacers are comprised of silicon nitride ($Si_3N_4$).

8. The method of claim 1, wherein said conductive material forming said gate structure is comprised of a metal.

9. The method of claim 1, wherein said drain and source dopant is an N-type dopant for fabrication of an NMOSFET (N-channel Metal Oxide Semiconductor Field Effect Transistor).

10. The method of claim 1, wherein said drain and source dopant is a P-type dopant for fabrication of a PMOSFET (P-channel Metal Oxide Semiconductor Field Effect Transistor).

11. A method for fabricating a MOSFET (metal oxide semiconductor field effect transistor) on a semiconductor substrate in SOI (semiconductor on insulator) technology, the method including the steps of:

A. depositing a film of semiconductor material on a layer of buried insulating material comprised of silicon dioxide ($SiO_2$) formed on said semiconductor substrate, wherein said film of semiconductor material is comprised of silicon having a thickness in a range of from about 5 nanometers to about 20 nanometers;

B. depositing a layer of active insulating material on said film of semiconductor material, wherein said layer of active insulating material is comprised of silicon nitride ($Si_3N_4$) having a thickness in a range of from about 100 nanometers to about 200 nanometers;

C. patterning a masking material to form a masking structure and etching away any portion of said layer of active insulating material and said film of semiconductor material not under said masking structure;
      wherein said layer of active insulating material remaining under said masking structure forms an insulating block, and wherein said film of semiconductor material remaining under said insulating block forms a semiconductor island;
      and wherein said masking structure, said insulating block, and said semiconductor island have a width in a range of from about 50 nanometers to about 300 nanometers;

D. removing said masking structure from top of said insulating block;

E. forming sacrificial oxide on sidewalls of said semiconductor island and etching away said sacrificial oxide from said sidewalls of said semiconductor island to remove surface damage at said sidewalls of said semiconductor island;

F. growing a semiconductor material from sidewalls of said semiconductor island to extend up along sidewalls of said insulating block to form a raised drain structure on a first side of said insulating block and said semiconductor island and to form a raised source structure on a second side of said insulating block and said semiconductor island;

G. implanting a drain and source dopant into said raised drain and source structures;
      wherein said drain and source dopant is an N-type dopant for fabrication of an NMOSFET (N-channel Metal Oxide Semiconductor Field Effect Transistor);
      and wherein said drain and source dopant is a P-type dopant for fabrication of a PMOSFET (P-channel Metal Oxide Semiconductor Field Effect Transistor);

H. performing a thermal anneal to activate said drain and source dopant within said raised drain and source structures and such that said drain and source dopant extends partially into said semiconductor island;

I. forming a drain silicide within said raised drain structure and forming a source silicide within said raised source structure;

J. forming a capping oxide layer on said drain and source silicides;

K. etching away said insulating block to form a block opening;

L. conformally depositing a layer of said high dielectric constant material on said capping oxide layer and on sidewalls and said bottom wall of said block opening;

M. forming spacers comprised of silicon nitride ($Si_3N_4$) on sidewalls of said block opening; and N. filling said block opening with a conductive material to form a gate structure disposed over said semiconductor island,
      wherein said conductive material is comprised of a metal;
      and wherein a portion of said semiconductor island disposed under said gate structure forms a channel region that is fully depleted during operation of said MOSFET.

* * * * *